United States Patent
Rogers

(10) Patent No.: US 7,064,832 B2
(45) Date of Patent: Jun. 20, 2006

(54) COLOR AND INTENSITY MEASURING MODULE FOR TEST OF LIGHT EMITTING COMPONENTS BY AUTOMATED TEST EQUIPMENT

(75) Inventor: David P. Rogers, Clifton Park, NY (US)

(73) Assignee: Delaware Capital Formation, Inc., Wilmington, DE (US)

( * ) Notice: Subject to any disclaimer, the term of this patent is extended or adjusted under 35 U.S.C. 154(b) by 319 days.

(21) Appl. No.: 10/764,744

(22) Filed: Jan. 26, 2004

(65) Prior Publication Data

US 2004/0173732 A1    Sep. 9, 2004

Related U.S. Application Data

(60) Provisional application No. 60/450,033, filed on Feb. 26, 2003.

(51) Int. Cl.
*G01J 3/50* (2006.01)

(52) U.S. Cl. .................................. 356/406; 250/226

(58) Field of Classification Search ................ 356/402, 356/405, 406, 416, 419
See application file for complete search history.

(56) References Cited

U.S. PATENT DOCUMENTS

| | | | |
|---|---|---|---|
| 3,215,843 A | 11/1965 | Neil | |
| 3,484,614 A | 12/1969 | Tobey et al. | |
| 3,511,999 A | 5/1970 | Pelenc | |
| 3,609,450 A | 9/1971 | Hart | |
| 3,681,654 A | 8/1972 | Quinn | |
| 3,963,920 A | 6/1976 | Palmer | |
| 3,996,494 A | 12/1976 | Suga | |
| 4,234,820 A | 11/1980 | Widmayer | |
| 4,275,294 A | 6/1981 | Davidson | |
| 4,427,881 A | 1/1984 | Ruell | |
| 4,529,875 A | 7/1985 | Brogardh et al. | |
| 4,544,843 A | 10/1985 | Kern et al. | |
| 4,775,640 A | 10/1988 | Chan | |
| 4,808,815 A | 2/1989 | Langley | |
| 6,384,612 B1 | 5/2002 | Freund et al. | |
| 6,490,037 B1 | 12/2002 | Schmitt | |

FOREIGN PATENT DOCUMENTS

| | | |
|---|---|---|
| EP | 0628830 A2 | 12/1994 |
| EP | 1260877 A2 | 11/2002 |
| JP | 03133183 A | 6/1991 |
| JP | 2004045282 A | 2/2004 |
| WO | WO 01/84901 A1 | 11/2001 |
| WO | WO 02/090909 A2 | 11/2002 |

OTHER PUBLICATIONS

Copy of European Search Report dated May 27, 2004 (2 pages); EPO Appln. No. 04090056.

(Continued)

*Primary Examiner*—F. L. Evans
(74) *Attorney, Agent, or Firm*—Christie, Parker & Hale, LLP

(57) ABSTRACT

A test module used to verify the correct placement of light-emitting devices on electronic assemblies, by performing color and luminous intensity tests on these devices. The module includes one or a number of color sensitive photodiodes, which when exposed to light coupled from the emitter under test, will accurately measure the intensity, as well as the true color emitted by the device. The test module outputs analog signals, one directly proportional to the intensity, a second voltage proportional to the spectral wavelength of the device under test.

17 Claims, 3 Drawing Sheets

OTHER PUBLICATIONS

Patent Abstract of Japan for Publication No. 2000-221113; date of publication Aug. 11, 2000; Inventor Morimoto Teruo, et al.

Patent Abstracts of Japan, Publication No. 03133183 A; date of publication Jun. 6, 1991.

Patent Abstracts of Japan; Publication No. 2004045282 A; date of publication Feb. 12, 2004.

CIE 1964 1nm COLOR MATCHING FUNCTIONS

CIE 1964 1nm COLOR RATIO MATCHING

COLOR AND INTENSITY MEASURING MODULE FOR TEST OF LIGHT EMITTING COMPONENTS BY AUTOMATED TEST EQUIPMENT

CROSS-REFERENCE TO RELATED APPLICATION(S)

This application claims priority from U.S. Provisional Application No. 60/450,033 filed Feb. 26, 2003.

FIELD OF THE INVENTION

The present invention relates to the optical testing of light-emitting components and, more particularly, to a test module which may be used in conjunction with conventional automatic test equipment to optically test light-emitting components.

BACKGROUND OF THE INVENTION

Electronic assemblies are built with a multitude of light-emitting components, primarily light emitting diodes (LED's), to indicate functions, or faults occurring on the assemblies. In addition to light, information on the nature of the operations of faults on these assemblies is conveyed by the color emitted by the devices. Light emitting diodes are available in colors covering the entire visible spectrum as well as white.

Various methods have been implemented to verify the correct operation of these light-emitting components, from test sequences where human verification is used, to photo detectors employed to perform the tests automatically.

Human verification is slow and unreliable. While photo-detectors can easily verify that light is present, validation of the correct color has become extremely important. Photo-detectors employing narrow bandpass color filters have been employed to test for the proper emitted wavelength, with limited success, since variations in output levels of the photodetector cannot discriminate intensity from colors approaching the edge of the passband. This becomes critical in the very narrow color bands in the visible spectrum.

In addition, these implementations require that each photodetector be customized for the particular wavelength of the light-emitting component under test, adding lead time and expense to their use. Current photodetector solutions are available in various configurations, some having the detector itself mounted near the light-emitting component, where others use fiber optic cable to collect the light and present it to a remotely mounted photodetector. Consequently, a need exists for a test module for automated test equipment to test light emitting components which addresses the problems associated with prior test apparatus.

SUMMARY OF THE INVENTION

The present invention provides a test module and a method to accurately test the operation of light-emitting devices described, and provides parametric values for color and luminous intensity, which can be compared automatically to expected values. The test module contains a sensor or plurality of sensors, each of which contains three photodetectors. The three photodetectors are individually filtered to pass the red, green, and blue portions of the visible spectrum.

When the light from the photo-emitter to be tested is presented to this three-color sensor, the individual outputs of the detectors divide the light into levels of red, green, or blue component. After signal conditioning the individual color components are converted to digital values, then presented to a preprogrammed microcontroller.

The microcontroller is programmed to use the combination of all of the color component values to determine the luminous intensity and the ratios of the individual color values to algorithmically match the monochromatic input color to wavelength, based on CIE color matching values. Additional tests are made to determine if the color components are all above a preset threshold, indicating the presence of a white color source.

The microcontroller presents the wavelength and intensity values to digital to analog converters, which produce an analog wavelength value linearly scaled to the visible spectrum, 380 nanometers through 700 nanometers, and an intensity output linearly representing luminous intensity. In the case of white, a voltage value above the visible values will be output to indicate the presence of white light. Light levels below a preset low limit will force both the color and intensity outputs to zero volts.

These voltage values are read by the automatic test system and compared against expected values to determine if the correct light-emitting component has been installed and is operating correctly in the assembly.

The test module described provides a low cost and easily implemented method of performing parametric color tests on light-emitting devices. It requires no calibration or setup once installed in the test apparatus.

DETAILED DESCRIPTION

Figure 1:
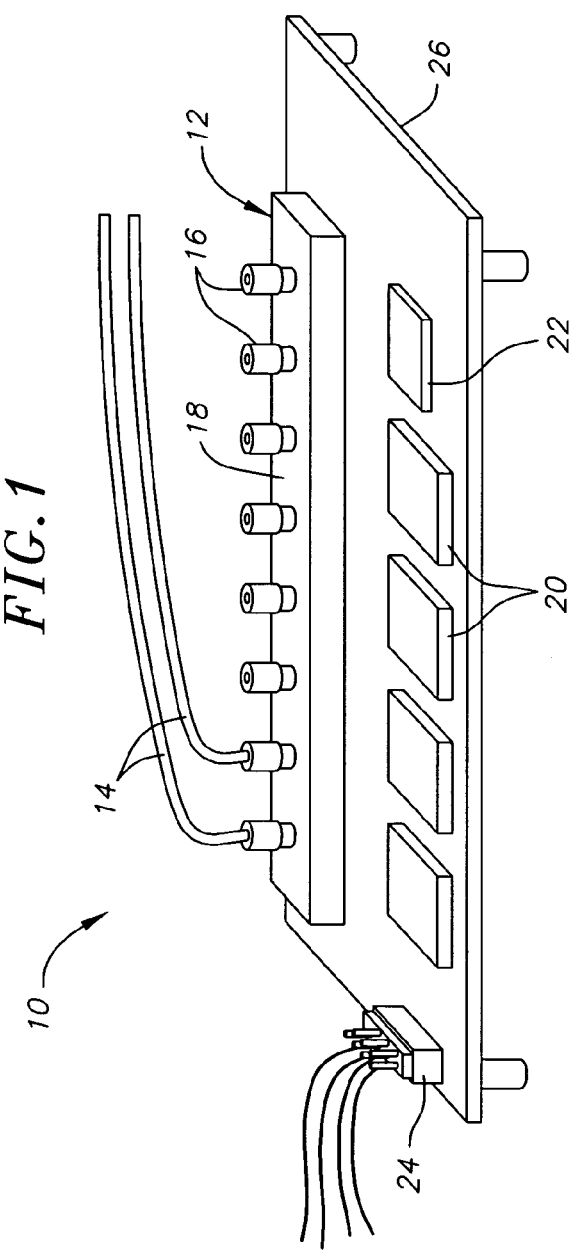
FIG. 1 is a schematic perspective view of the light testing module of the present invention.

Referring to FIG. 1, the light testing module 10 of the present invention consists of an assembly of sensors 12 to which the light from the emitter under test is presented. In the implementation shown, the light is piped to the sensors using fiber optic cable(s) 14 connecting to the sensors using plastic fiber connector(s) 16. The sensors are located under a light shield 18 to prevent entrance of ambient light. Electronics 20 on the assembly condition the sensor signals, process the red, green, and blue components of the light, and produce wavelength and intensity outputs. Additional electronics 22 is provided to select one of n sensors on the module corresponding to the light-emitter currently under test. A connector 24 is provided for wiring the test module to automatic test apparatus to provide power for operation, one of n sensor selection, and output values. All of the components of the test module 10 can be mounted on a printed circuit board 26 or other suitable device.

Figure 2:
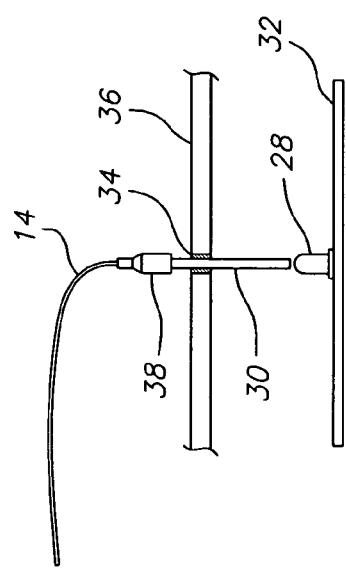
FIG. 2 is a detailed view of the test probe of the module of FIG. 1.

FIG. 2 is a detail view of the termination of the fiber optic cable 14 at the light emitting device 28 to be tested. An end of the flexible plastic optical fiber 14 is encased in a rigid tube 30 to provide pointing accuracy to the device under test 28 mounted on a printed circuit board 32. The fiber optic cable is cut flush with the end of the tube 30, and held in position using adhesive backed heat shrink tubing to hold the fiber in position in the tube. The supporting tube is mounted rigidly, preferably by an adhesive 34, to a plate 36 to provide centering of the assembly at the optical center of the device under test 28, as well as providing a minimal spacing from the device to prevent damage to the fiber or device under test. A connector 38 is positioned on an end of the tube 30. The numerical aperture (acceptance angle) of the optical fiber is such that a portion of the emitted light is collected by the fiber, dependent on the viewing angle of the light-emitting device under test, and the spacing of the fiber from the light-emitting device. Since color determination is accomplished using ratios of the primary colors, the percentage of the total light collected is not critical to the measurement.

While this particular implementation uses fiber optics to couple the light, alternatively, similar modules could be implemented where the light sensor is mounted at the light-emitter under test, and electrically connected to the electronics on the test module for processing.

Figure 3:
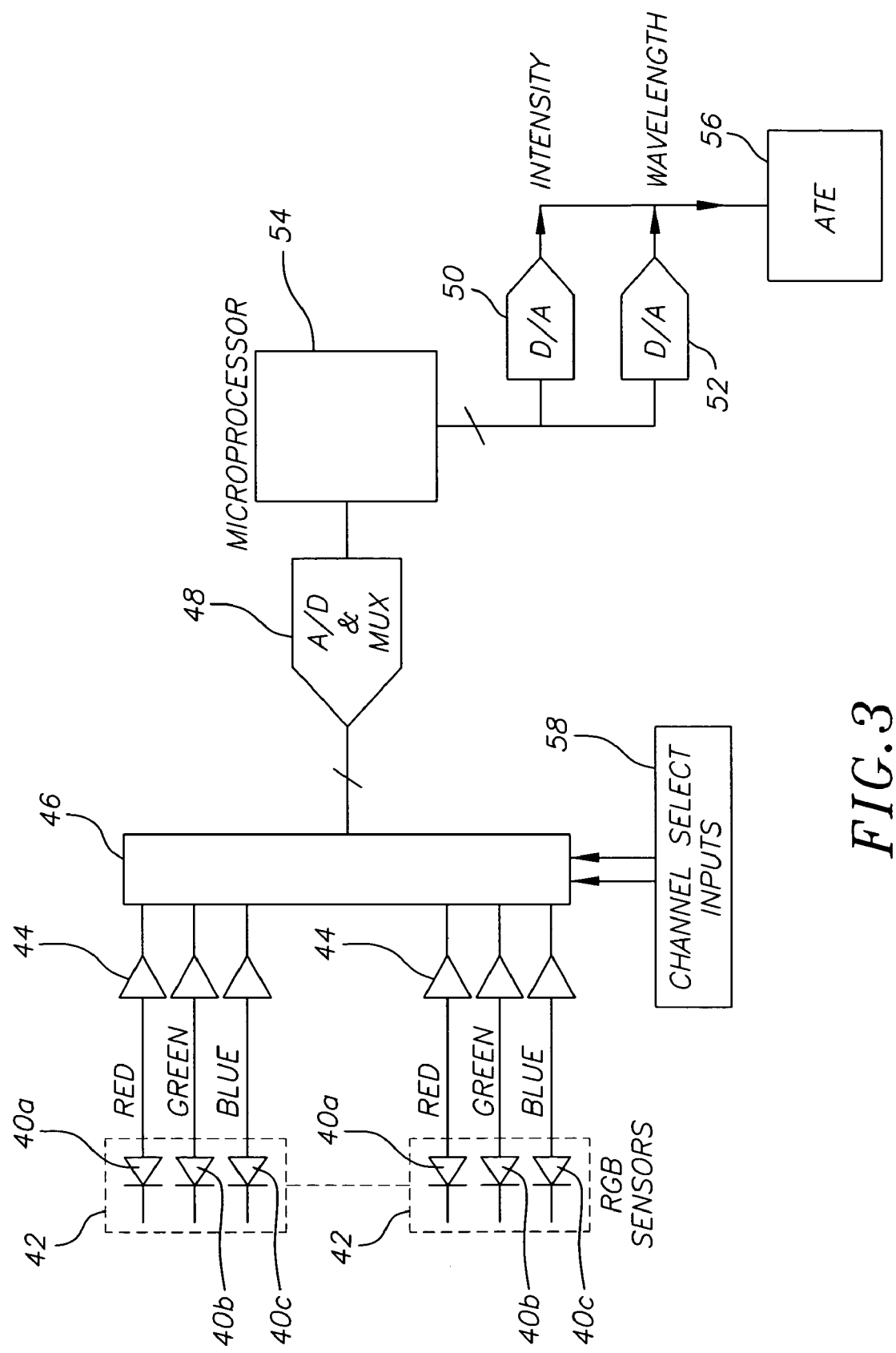
FIG. 3 is a schematic view of the test module of FIG. 1.

Referring to the schematic in FIG. 3, the individual color photodiodes 40a, 40b and 40c which comprise the sensors 42 are amplified 44 then selected by an analog multiplexer 46. The analog signals are then digitized by the analog to digital converter 48. Two digital to analog converters 50 and 52 convert the calculated values of wavelength and intensity from the microprocessor 54 to analog values which can be read back to the automatic test apparatus 56 for pass/fail comparison.

The preprogrammed microprocessor 54 performs calculations to determine intensity, and wavelength of the incoming light. Luminous intensity is calculated as a function of the total energy captured by the red, green and blue photodiodes, factored by the preconditioning and equalization which has been done. First, tests are run to determine if sufficient light intensity is present to process. Below the present limit, the processing will terminate, and zero volts programmed to both the intensity and wavelength analog to digital converters to indicate no useable signal is present.

If the low limit tests pass, tests are then performed to check for equality of all three color components for white light determination. If the red, green, and blue components are equal within a preset percentage, color calculations are skipped, and the wavelength output value is set to a predetermined output voltage level which indicates a white source is present.

Figure 4:
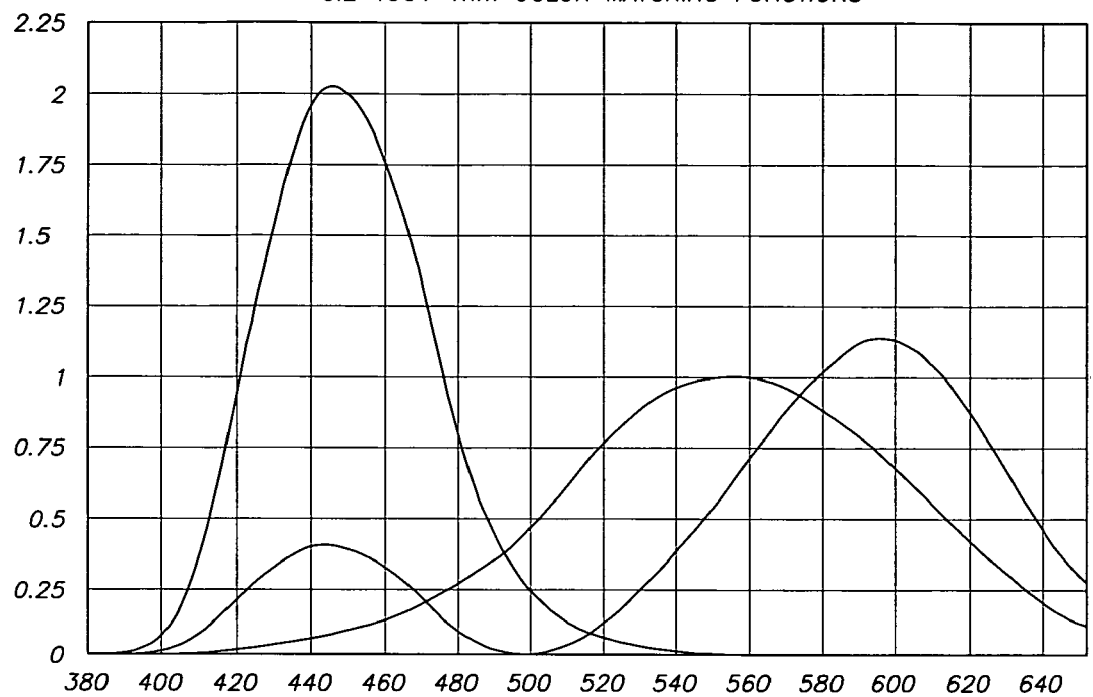
FIG. 4 is a CIE color matching chart.

If the test indicates the light is monochromatic, the color processing is run, first determining the order of the color by decreasing magnitude. Based on this order, sets of algorithms to calculate the wavelength are called. These algorithms calculate the wavelength by mathematical operations which convert the red, green, and blue magnitudes into wavelength based on the CIE color conversion values for human perception of color, as shown in the graph of FIG. 4.

Figure 5:
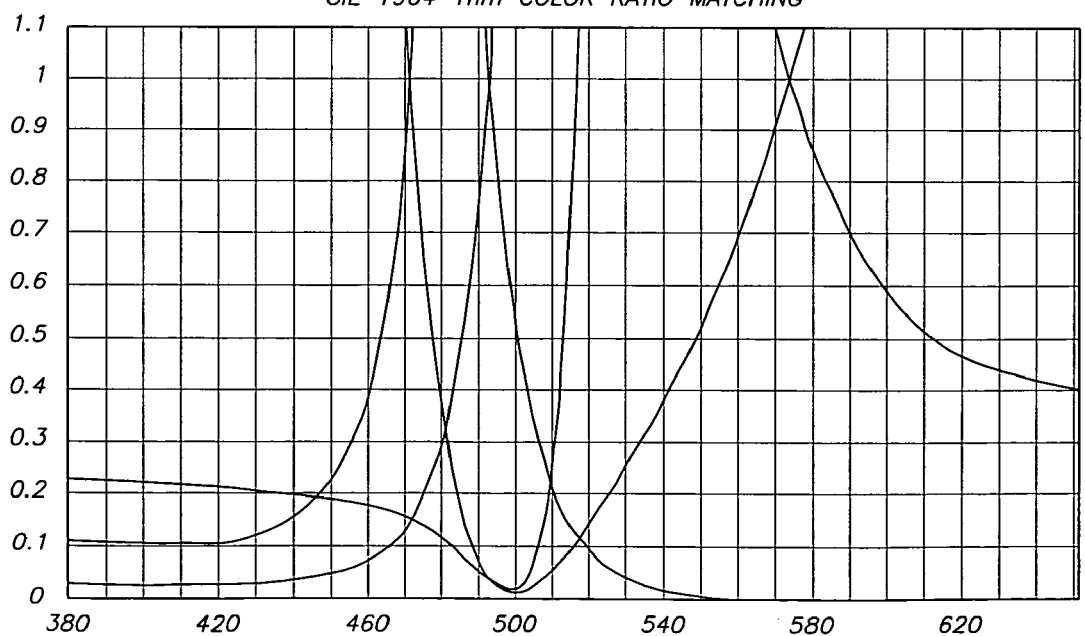
FIG. 5 is a CIE color ratio matching chart.

The chart shown in FIG. 5, shows the ratio of the red, green and blue color mix throughout the visible range. These ratios alternatively are calculated based on the levels present at the sensors, and used as an index into lookup tables contained in the microprocessor memory. These tables correlate the ratios of red, green, and blue directly into the equivalent wavelength in nanometers. The wavelength is converted to a scaled voltage, which is then output by the digital to analog converter.

Once the wavelength is determined, a digital value is output to the digital to analog converter, which represents a direct voltage match to the calculated wavelength. For instance, 550 nanometers would output 550 milivolts, or a multiple of that value, to make the voltage more readable by the automatic test system.

Additional inputs 58 to the module are provided for digital selection of the sensor to be addressed, as well as power to run the module.

The sensor or sensors are capable of detecting the content of red, green, and blue or the complements cyan, yellow and magenta, to allow for the weighing of the individual colors to determine the wavelength of an incoming beam. The sensor can be a monolithic tricolor sensor, or individual filtered photodiode sensors with the optics to disperse the light equally across the three sensors. The colors are not limited to three and can be any number or color, required to effectively differentiate the incoming wavelength. The test module has the capability of selecting the individual sensor, the processing capability to calculate the wavelength from the levels of the sensed colors, and an output interface to present the wavelength data to the automatic test equipment in a digital or analog form.

In one embodiment, the multi-color sensor and amplification or a plurality of sensors and amplifiers are mounted remotely, at the light emitting-device under test, and electrically connected to the remainder of the electronic processing. Alternatively, the multi-color sensor or a plurality of sensors can be mounted with the processing circuitry, for use with fiber optic cables used to collect the light from the light-emitting device under test and transmit the light signals to the sensors. The test module uses a predefined set of color ratios based on standard color matching tables, modified by sensor response, to determine wavelength by comparing the color ratios of the incoming light irrespective of the absolute values. The test module which provides a calculated wavelength output, based on the proportion of the content of colors detected in the light output of a monochromatic emitting device.

The test module also determines a white source from a light-emitting device when all of the color sensor levels contribute equally to total input. The test module converts the input light to an analog signal scaled directly from nanometers to milivolts or a multiple thereof throughout the visible spectrum of 380 nm to 700 nm, and uses a unique voltage level in excess of the range of visible spectrum converted voltages to denote the detection of a white source.

What is claimed is:

1. A test module for optically measuring color and intensity of light emitted from light-emitting devices comprising:
   a plurality of sensors, each sensor having three photodetectors individually filtered to pass red, green, and blue portions of visible light, and each sensor producing a sensor signal; and
   electronics for receiving and conditioning each sensor signal to produce wavelength and intensity output signals.

2. The test module of claim 1 wherein the electronics include a microcontroller programmed to use a combination of all color component values to determine intensity and ratios of individual color values to algorithmically match a monochromatic input color to wavelength based on CIE color matching values.

3. The test module of claim 1 further comprising fiber optic cables positioned between the light-emitting devices under test and the sensors.

4. The test module of claim 3 wherein at least a portion of the fiber optic cable is positioned in a tube which is rigidly mounted in the test module adjacent the light-emitting devices under test.

5. The test module of claim 1 wherein the sensors are positioned under a light shield.

6. The test module of claim 1 wherein the electronics further include amplifiers and an analog multiplexer.

7. A color and intensity test module for automated test equipment comprising:
- a sensor assembly capable of detecting color content of light emitted from a unit under test;
- means for processing the color content to calculate intensity and wavelength data of the light emitted from the unit under test; and
- an output interface to present the intensity and wavelength data to the automated test equipment in digital or analog form;
- wherein the means for processing uses a predefined set of color ratios based on standard color matching tables to determine wavelength by comparing the color ratios of the light emitted by the unit under test.

8. The test module of claim 7 wherein the sensor assembly are mounted remotely at the unit under test and electrically connected to the means for processing.

9. The test module of claim 7 wherein the sensor assembly includes fiber optic cables used to collect light signals from the unit under test and transmit the light signals to the sensor assembly.

10. The test module of claim 7 wherein the means for processing calculates wavelength based on a proportion of the red, green, and blue content of the light detected for a monochromatic emitting device.

11. The test module of claim 7 wherein the means for processing determines a white source from a unit under test when all color sensor levels contribute equally to a total input.

12. The test module of claim 7 wherein the means for processing further converts an input light to an analog signal scaled directly from nanometers to milivolts or a multiple thereof throughout a visible spectrum of 380 nm to 700 nm.

13. A method to test color and intensity of a light-emitting device comprising the steps of
- detecting light from the light-emitting device by a three-color sensor;
- filtering the light into levels of red, green, and blue;
- conditioning the red, green, and blue levels;
- converting the levels into digital values;
- generating an analog wavelength value linearly scaled to the visible spectrum;
- generating an intensity value linearly representing luminous intensity; and
- reading the wavelength value and the intensity value and comparing the values against expected values.

14. The method of claim 13 wherein the step of comparing uses a predefined set of color ratios based on standard color matching tables to determine wavelength by comparing the color ratios of the detected light irrespective of an absolute value.

15. The method of claim 13 wherein the step of generating a wavelength value provides a calculated wavelength output, based on a proportion of the red, green, and blue colors detected by a monochromatic emitting device.

16. The method of claim 13 wherein the step of converting converts the detected light to an analog signal scaled directly from nanometers to milivolts or a multiple thereof through a visible spectrum of 380 nm to 700 nm.

17. The method of claim 13 wherein the steps of conditioning and filtering condition and filter the compliment colors of red, green and blue.

* * * * *